United States Patent [19]

Geyling

[11] Patent Number: 5,284,805
[45] Date of Patent: Feb. 8, 1994

[54] RAPID-SWITCHING ROTATING DISK REACTOR

[75] Inventor: Franz T. Geyling, Austin, Tex.

[73] Assignee: Sematech, Inc., Austin, Tex.

[21] Appl. No.: 823,488

[22] Filed: Jan. 21, 1992

Related U.S. Application Data

[62] Division of Ser. No. 728,433, Jul. 11, 1991, Pat. No. 5,264,040.

[51] Int. Cl.$^5$ .................................................. B05C 5/00
[52] U.S. Cl. ..................................... 437/231; 29/25.01; 427/248.1; 427/300
[58] Field of Search .................. 29/25.01; 118/50.1, 118/634, 730, 725, 715, 719, 62, 63, 66, 695; 427/240, 248.1, 300; 437/228, 231; 156/613

[56] References Cited

U.S. PATENT DOCUMENTS

| | | | |
|---|---|---|---|
| 4,667,076 | 5/1987 | Amada | 29/25.01 |
| 4,798,166 | 1/1989 | Hirooka et al. | 118/425 |
| 4,878,989 | 11/1989 | Purdes | 156/613 |
| 4,907,534 | 3/1990 | Huang et al. | 118/725 |
| 5,070,813 | 12/1991 | Sakai et al. | 118/695 |
| 5,160,543 | 11/1992 | Ishihara et al. | 118/725 |

FOREIGN PATENT DOCUMENTS

| | | |
|---|---|---|
| 0167703 | 1/1986 | European Pat. Off. |
| 58-197732 | 11/1983 | Japan |
| 61-194829 | 8/1986 | Japan |
| 62-244124 | 10/1987 | Japan ................................. 118/730 |
| 63-79328A | 9/1988 | Japan |
| 1-190114 | 5/1989 | Japan |
| 2-72638 | 3/1990 | Japan ................................. 29/25.01 |

OTHER PUBLICATIONS

Patent Abstracts of Japan, vol. 8, No. 59 (E-232) (1496) Mar. 17, 1984 & JP.A.58 209 117 (Nippon Denshin Denwa Kosha) Dec. 6, 1983.
Journal of Crystal Growth, vol. 107, No. 1/4, Jan. 1, 1991, Amsterdam NL, G. S. Tompa et al., "MOVPE growth of II-VI compounds in a vertical reactor with high-speed horizontal rotating disk", pp. 198-202.

*Primary Examiner*—Olik Chaudhuri
*Assistant Examiner*—David Mason
*Attorney, Agent, or Firm*—William W. Kidd

[57] ABSTRACT

A rapid switching rotating disk reactor has an elongated injector for injecting an inert gas into the chamber of a rotating disk reactor. The nozzle of the injector is proximate to the center of the rotating wafer for the purpose of providing an inert gas flow to produce an inert gas boundary layer above the wafer. Whenever the environment of the chamber is to be changed by an introduction of another fluid medium, the injector is activated to provide an inert boundary layer atop the semiconductor wafer, wherein any processing caused by the reactive gases in the chamber is prevented from occurring. Once the chamber is filled with the subsequent fluid medium, the injector is turned off in order for the next processing to commence.

2 Claims, 1 Drawing Sheet

RAPID-SWITCHING ROTATING DISK REACTOR

This application is a division of application Ser. No. 728,433, filed Jul. 11, 1991, now U.S. Pat. No. 5,264,040.

1. Field of the Invention

The present invention relates to the field of semiconductor manufacturing techniques and, more particularly, to an apparatus for processing a semiconductor wafer.

2. Prior Art

In a typical semiconductor integrated circuit fabrication process, integrated circuit devices are constructed onto a preformed semiconductor wafer. These wafers are typically flat and circular in shape. For silicon semiconductor wafers, the diameter of the current wafers vary from approximately four inches to eight inches. By utilizing a number of various processing techniques, which may include doping, implanting, depositing, etching, to name a few, a number of completed integrated circuit "chips" are formed on a given wafer. Subsequently, the wafer is cut to separate each independent chip and then packaged for use.

Due to the trend towards the use of larger diameter wafers and the continued transition toward submicron-dimensioned features, the semiconductor industry is moving toward a single wafer processing technique, instead of the batch processing technique well-known in the prior art for processing smaller diameter wafers. In a typical single wafer processing technique for depositing and/or etching various wafer layers, a single wafer is typically disposed onto a wafer platen ("chuck"), which is typically resident in an enclosed reactor chamber. In order to perform the various depositing and/or etching steps in the manufacture of integrated circuits, various gases are introduced into the reactor chamber under preselected chamber environment to deposit or etch a given layer on the wafer.

With the advent of submicron-dimensioned features, it has become critical to control the tolerances of the various processes in order to control the minute dimensions required of various devices and interconnecting lines in or on the wafer. The construction of the particular reactor chamber, as well as the various processing parameters, such as chamber pressure, gas flow, gas mixture, etc., play a critical role in providing for the submicron-dimensioned features. Thus, many of the prior art reactors are incapable of providing for such tolerances to fabricate submicron-dimensioned integrated circuit devices.

One type of a specialized reactor is a rotating disk reactor (RDR). A RDR includes a reactor chamber with a wafer platen or chuck resident therein. However, unlike other reactors, the wafer chuck of the RDR rotates at a high rate of speed. The rotation of the chuck and the wafer provides for a uniform gas or plasma flow over the wafer which resides atop the chuck. The RDR is exceptionally useful when a thin layer is to be deposited onto the wafer. RDR technology is wellknown in the prior art and one such RDR is manufactured and sold by EMCORE Corporation of Somerset, New Jersey.

One disadvantage of prior art RDRs is the inability of the RDR to switch rapidly from one process gas to another. That is, when one gas mixture is to be replaced by a second gas mixture in the chamber for a subsequent processing step, a finite amount of time is required for the internal environment of the chamber to change completely from the first gas mixture to the second. Unfortunately, reactions continue to occur on the wafer while the gas mixtures are being interchanged and, in many instances, this continued processing is uncontrollable.

Accordingly, it is appreciated that what is desired is a rotating disk reactor which has the capability of subjecting the wafer to rapid switching between the processing gases.

SUMMARY OF THE INVENTION

A rapid switching rotating disk reactor is described in which an elongated injector injects an inert gas onto a wafer which resides on a rotating wafer chuck. The nozzle of the injector is proximal to the center of the rotating wafer for the purpose of providing an inert gas flow to produce an inert gas boundary layer above the wafer as the gas flows from the center to the periphery of the wafer.

At anytime in which the wafer is to be isolated from the reactive fluid medium in the chamber, the inert gas is activated to form a boundary layer. The boundary layer operates as an isolating medium by isolating the reacting fluid from the wafer. The mass and the rate of flow of the inert gas are of sufficient values to prevent the cross-diffusion of reactants across the boundary layer.

In one example, a deposition/etch process requires one gas for deposition while a second gas is used for etching. After the deposition step is completed, the injector is used to activate the inert gas to form the boundary layer. After the evacuation of the first gas, the second gas is introduced into the chamber. Then, the inert gas is turned off in order for the etching process to occur. Although, a notable time lapse will be encountered to replace the chamber with the second gas, the wafer will actually experience a rapid switching (an almost instantaneous change between the two gases.)

DETAILED DESCRIPTION OF THE PREFERRED EMBODIMENTS

An apparatus and method for processing a single semiconductor wafer in a rotating disk reactor is described. In the following description, numerous specific details are set forth, such as specific materials, structures, processes, etc., in order to provide a thorough understanding of the present invention. However, it will be obvious to one skilled in the art that the present invention may be practiced without these specific details. In other instances, well-known processes and structures have not been described in detail in order not to unnecessarily obscure the present invention.

Prior Art

Figure 1:
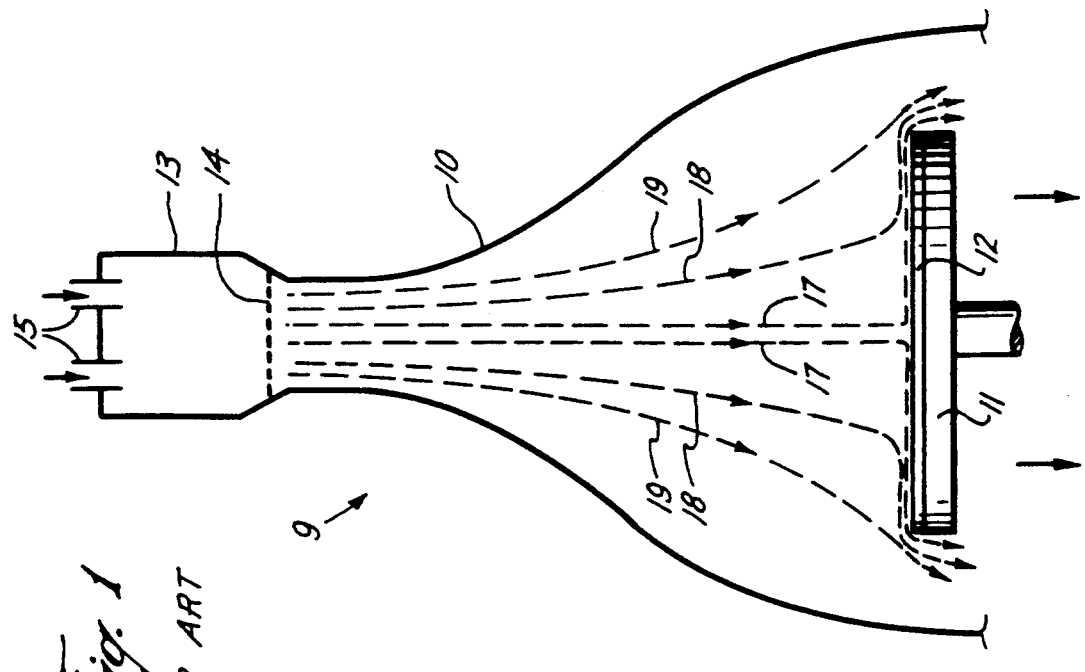
FIG. 1 is a cross-sectional view of a prior art rotating disk reactor.

Referring to FIG. 1, a prior art rotating disk reactor (RDR) 9 is shown. The reactor 9 is comprised of a mixing chamber 13, diffuser screen 14 and reactor chamber 10 for processing a semiconductor wafer 12, which is resident on a wafer platen 11. The wafer platen 11 is commonly referred to as a "chuck" and is resident in reactor chamber 10. The purpose of chambers 10 and 13 is to provide an enclosed container for containing the various gases required in the processing of wafer 12.

In order to introduce the various gases, openings 15 are provided at the upper end of mixing chamber 13 for the injection of such gases. In the specific example of FIG. 1, two gas supply openings 15 are shown in the upper end of the mixing chamber 13. As is shown, a first gas mixture is introduced through the first of the openings 15, while a second gas mixture is introduced through the second of the opening 15.

The gases from the two openings 15 enter the mixing chamber 13 and combine to form a homogeneous nutrient. The homogeneous nutrient is diffused as it passes the diffuser screen 14, which is disposed between the two chambers 13 and 10. The diffused nutrient then enters the reactor chamber 10. It is to be appreciated that the details of the structures of the mixing chamber 13 and diffuser screen 13 are a design choice and various schemes can be readily implemented to introduce and mix the desired gases.

The chuck 11, which is circular in shape to accommodate a circular semiconductor wafer 12, resides at the lower, or enlarged, end of reactor chamber 10. In a typical RDR reactor, chuck 11 is made to rotate at a high rate of speed in the approximate range of 800–2000 rpm. Wafer 12 resides upon chuck 11 and is clamped to chuck 11 by vacuum inlets or by a close-fitting recess.

In operation, a first gas is introduced, such as by injection, through the first of the openings 15 upon the commencement of a given processing step, such as the depositing of a formation layer onto wafer 12. Due to the force of the gas being injected and the lower pressure caused by an exhaust pump (not shown) coupled to the lower end of chamber 10, the gas mixture tends to flow downward in the reactor chamber 10. The path of this gas flow is approximately illustrated by dashed lines 17, 18, and 19 in FIG. 1. Because of the rotation of the wafer 12, gases impinging onto the wafer 12 are forced toward the outer edge of the wafer, primarily due to the centrifugal force exerted by the rotating action of the wafer 12. This action allows for a uniform flow of the gas nutrients across the surface of the wafer 12, thereby providing for a substantially uniform gas layer across the exposed surface of the wafer 12 in order to perform the desired processing. The operation of such a RDR 9 is well known in the prior art and one such reactor is available from the aforementioned EMCORE Corporation.

When a desired thickness has been deposited onto wafer 12 during this particular processing step, the gas flow through the first opening 15 is terminated in order to proceed with the subsequent processing step. A successive processing step typically requires the introduction of a different reactant into chamber 10. When the next processing step is to commence, a second gas mixture is introduced, such as by injection, through the second of the openings 15 into chamber 13. Again, with the desired gas flow illustrated by the dashed lines 17, 18, and 19, the subsequent processing step occurs in chamber 10. For example, this second process may be an etching step in a combined deposition/etching (dep/etch) process.

One significant disadvantage of the prior art RDR 9 is the time required to completely replace the first gas in the chamber with the second gas. What is desired is an abrupt, instantaneous, transition (simultaneous switching) of the gas content in chamber 10. However, in a prior art RDR 9, some finite amount of time is required to completely replace the first gas mixture in the chamber with the second gas mixture. During this transition period, undesirable processing of the wafer 12 by the first gas may continue which processing may be nonuniform, unpredictable and uncontrollable, due to the complex transient flow conditions of the chamber 10. For the growth of very thin layers, for example germanium on silicon or formation of group III-V hetero-structures, such transition times are undesirably long and can cause irregular interface growth on wafer 12.

It is to be noted that although two openings 15 are shown in FIG. 1, it is for exemplary purposes only. The actual number of openings is a mere design choice. Furthermore, for any given process step a number of different gases can be introduced into chamber 13 through a plurality of openings for mixing in chamber 13. For example, with the RDR 9 of FIG. 1, two different gases can be injected into chamber 13, each gas through a separate opening 15, and mixed in chamber 13.

Present Invention

Figure 2:
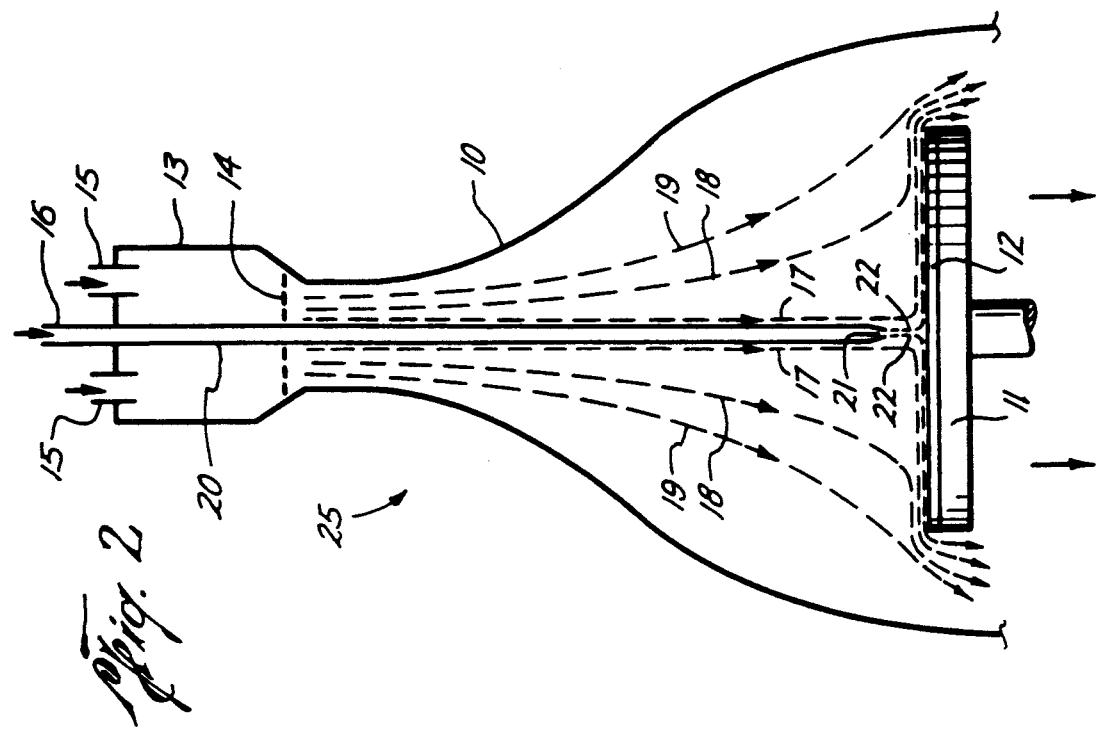
FIG. 2 is a cross-sectional view of a rotating disk reactor of the present invention which utilizes a neutral gas injector for rapid switching.

In order to overcome the undesirable transitions of the prior art rotating disk reactor, a rapid switching rotating disk reactor 25 of the present invention is utilized. Referring to FIG. 2, the rotating disk reactor (RDR) 25 of the present invention is shown. Although a variety of alternative reactor configurations can be readily utilized, the structure of the prior art reactor 9 is duplicated in FIG. 2 for ease of understanding the present invention. Again, two openings 15 are shown but the actual number of such openings 15 is a design choice.

Reactor 25 is comprised of mixing chamber 13, openings 15, diffuser screen 14, reactor chamber 10 and chuck 11 which has a semiconductor wafer 12 resident thereon. In addition, reactor 25 includes an injector 20, which enters chamber 13 through opening 16 and substantially extends the length of the reactor chambers 10, and 13 to have a nozzle opening 21 proximate to the center of the wafer 12 Opening 16 is centrally located and is of sufficient size to permit the passage of injector 20 but provides a seal to prevent the escape of gas from the chamber 13. One of the purposes of injector 20 is to provide for the injection of an inert gas, such as argon, under pressure onto the surface of wafer 12. The purpose of the inert gas is to provide for a boundary layer on the surface of wafer 12 as is shown by dotted line 22 in FIG. 2.

In operation, a fluid, such as a gas or a gas mixture, is introduced into mixing chamber 13 through openings 15, as was the case in the prior art reactor 9 of FIG. 1. The gas nutrient is then diffused and introduced into reactor chamber 10 The introduction of this gas nutrient is shown by dotted lines 17, 18, and 19 in FIG. 2 This particular processing of the gas nutrient is equivalent to that process which takes place in the prior art reactor 9 of FIG. 1. However, when the first processing step is completed, the inert gas is introduced into the chamber 10 by injector 20. The flow of the inert gas from a nozzle 21 of injector 20 is of sufficient force to provide an inert gas boundary (or barrier) layer 22 above wafer 12. Due to the rotation of wafer 12, this boundary layer 22 of inert gas is substantially uniform over the complete wafer.

It is to be appreciated that this boundary layer 22 must be of sufficient thickness and of sufficient flow in order to prevent the cross-diffusion of reactants during the typical transit time of the inert gas from the center to the periphery of the wafer disk. As long as the fluid of the first processing step in chamber 10 does not diffuse across this boundary layer 22 onto wafer 12, any processing due to the presence of the first fluid will have ceased on the wafer surface.

Subsequently, a second fluid mixture (i.e., second gas nutrient) is introduced into chamber 10 in order to perform the subsequent processing step. However, unlike the prior art reactor of FIG. 1, the present reactor 25 continues to provide the flow of inert gas from nozzle 21 in order to maintain the inert boundary layer 22 above wafer 12 When the interior of the chamber 10 reaches the desired environment for the second fluid to perform the subsequent processing step, the inert gas flow from injector 20 is stopped. When the inert gas flow ceases, the boundary layer 22 is no longer present above wafer 12 thereby permitting the second fluid to contact the surface of wafer 12. Thus, by the introduction of an inert gas boundary layer 22 above wafer 12, abrupt switching from one fluid mixture contacting the wafer 12 to the second mixture contacting wafer 12 can be achieved.

Although the actual elapsed time required to vacate chamber 10 of the first fluid and fill chamber 10 with the second fluid may actually take several seconds, the wafer itself is not subjected to the fluid transition period occurring within chamber 10. Wafer 12 actually experiences a abrupt switching from the first fluid mixture to the second fluid mixture, due to the blocking effect of the boundary layer 22.

As was previously noted, it is essential that the inert gas flow blocks any cross-diffusion of reactants during the typical transit time of the inert gas from the center to the periphery of the wafer 12. The amount of inert gas flow, as well as the thickness of the boundary layer, will depend on the particular chemical being utilized as the reactant in chamber 10, as well as the physical parameters such as the diameter of the wafer 12 and the speed of rotation of chuck 11.

One example is provided for an illustrative purpose only. In this example, selective metal deposition is achieved by chemical vapor deposition with the use of a cyclic deposition/etch technique. A number of such technique are well-known in the prior art. For example, in order to deposit metal on a 200 mm (8 inch) wafer disk, an argon gas barrier layer 22 of 1 to 2 cm thickness will need to be deployed. The necessary flow rate of the injected argon will be in the order of 20-60 liters per minute. It is to be appreciated that this is an example only and is not provided for the purpose of limiting the invention. Use of other gases will also necessitate other parameters in order to provide a sufficient blocking layer 22 by the injected inert gas.

It is to be further appreciated that in order to provide a sufficient boundary layer 22 for a variety of reactions, injector 20 can be made adjustable. Typically for a fixed injector 20, the nozzle 21 is positioned 1 to 3 cm above the wafer 12. But, by selectively adjusting the distance of nozzle 21 from wafer 12 for a given process reaction, the boundary layer 22 can be made to vary in order to provide sufficient boundary layer thickness for different reactions. Furthermore, this adjustability of the nozzle distance can be combined with the rate of flow of the inert gas from nozzle 21 in order to provide a rapid-switching RDR which is capable of being readily adapted to a variety of processing reactions which are to occur in the RDR chamber.

In this alternative embodiment, injector 20 can be made to move perpendicularly in relation to wafer 12 such that the distance from nozzle 21 and wafer 12 can be varied during gas injection and can provide additional flexibility in controlling the boundary layer 22.

The present invention uses quartz or stainless steel as material for injector 20. However, it is to be noted that other non-reactive materials can be readily used also. Furthermore, it is to be appreciated that various processes capable to be used in the RDR 9 of the prior art can be readily adapted for use with the RDR 25 of the present invention.

I claim:

1. A method of rapidly isolating a processing surface of a semiconductor wafer, which has no openings therethrough, from reactive fluid present in a chamber of a rotating disk reactor, comprising the steps of:

rotating said semiconductor at a rate of speed which provides for a uniform gas flow over said semiconductor wafer;

injecting a continuous flow of a nonreacting gas proximate to the center of said processing surface of said wafer from an injector disposed above said processing surface, wherein said nonreacting gas is injected from above said processing surface and flows from the center to periphery of said processing surface such that an inert boundary layer forms over said processing surface and is maintained due to a sufficient flow rate across said processing surface in order to inhibit said reactive fluid from reaching said processing surface of said wafer.

2. A method of rapidly switching from a first fluid to a second fluid in a processing of a semiconductor wafer, which has no openings therethrough, in a chamber of a rotating disk reactor, comprising the steps of;

introducing said first fluid into said chamber of said rotating disk reactor;

performing a first processing step using said first fluid on a processing surface of said wafer;

injecting a continuous flow of an inert gas proximate to the center of said processing surface of said wafer from an injector disposed above said processing surface, wherein said inert gas is injected from above said processing surface and flows from the center to periphery of said processing surface such that an inert boundary layer forms over said processing surface and is maintained due to a sufficient flow rate across said processing surface in order to inhibit said first fluid from reacting with said processing surface of said wafer;

introducing said second fluid into said chamber of said rotating disk reactor;

removing flow of said inert gas on said processing surface of said wafer in order to remove said boundary layer once said first fluid in said chamber is replaced by said second fluid;

performing a second processing step on said wafer using said second fluid.

* * * * *

UNITED STATES PATENT AND TRADEMARK OFFICE
CERTIFICATE OF CORRECTION

PATENT NO : 5,284,805
DATED : February 8, 1997
INVENTOR(S): Franz T. Geyling

It is certified that error appears in the above-identified patent and that said Letters Patent is hereby corrected as shown below:

Column 2, line 36, remove ",".

Column 4, line 40, remove ",".

Column 4, line 42, after "12" insert --.--.

Column 4, line 55, after "10" insert --.--.

Column 5, line 14, after "12" insert --.--.

Column 5, line 30, "a" should be --an--.

Column 5, line 46, "technique" should be --techniques--.

Column 6, line 40, ";" should be --:--.

Signed and Sealed this

Fifth Day of August, 1997

Attest:

BRUCE LEHMAN

Attesting Officer

Commissioner of Patents and Trademarks